US008350448B2

(12) United States Patent
Nagai et al.

(10) Patent No.: US 8,350,448 B2

(45) Date of Patent: Jan. 8, 2013

(54) ACTUATOR

(75) Inventors: Nobuyuki Nagai, Kanagawa (JP); Masayuki Sugasawa, Chiba (JP); Kazuomi Murakami, Aichi (JP)

(73) Assignee: Sony Corporation, Tokyo (JP)

( * ) Notice: Subject to any disclaimer, the term of this patent is extended or adjusted under 35 U.S.C. 154(b) by 479 days.

(21) Appl. No.: 12/724,532

(22) Filed: Mar. 16, 2010

(65) Prior Publication Data

US 2010/0244633 A1 Sep. 30, 2010

(30) Foreign Application Priority Data

Mar. 31, 2009 (JP) ................................ 2009-084104

(51) Int. Cl.
*H01L 41/08* (2006.01)
*H02N 2/00* (2006.01)

(52) U.S. Cl. ........................................ 310/328; 310/800

(58) Field of Classification Search .................. 310/328, 310/800
See application file for complete search history.

(56) References Cited

U.S. PATENT DOCUMENTS

| | | | | |
|---|---|---|---|---|
| 5,977,685 | A * | 11/1999 | Kurita et al. | 310/311 |
| 6,545,384 | B1 * | 4/2003 | Pelrine et al. | 310/309 |
| 6,876,125 | B2 * | 4/2005 | Basheer et al. | 310/311 |
| 7,038,357 | B2 * | 5/2006 | Goldenberg et al. | 310/328 |
| 7,064,473 | B2 * | 6/2006 | Ishibashi et al. | 310/330 |
| 7,583,009 | B2 * | 9/2009 | Nagai et al. | 310/328 |
| 7,679,268 | B2 * | 3/2010 | Yokoyama et al. | 310/328 |
| 7,696,669 | B2 * | 4/2010 | Kudoh | 310/311 |
| 7,800,847 | B2 * | 9/2010 | Nagai et al. | 359/813 |
| 8,203,254 | B2 * | 6/2012 | Takahashi | 310/328 |
| 8,253,308 | B2 * | 8/2012 | Ono et al. | 310/363 |
| 2005/0168113 | A1 * | 8/2005 | Hirai et al. | 310/800 |
| 2006/0076540 | A1 * | 4/2006 | Zama et al. | 252/500 |
| 2006/0102455 | A1 * | 5/2006 | Chiang et al. | 200/181 |
| 2006/0266642 | A1 * | 11/2006 | Akle et al. | 204/282 |
| 2007/0184238 | A1 * | 8/2007 | Hockaday et al. | 428/98 |
| 2007/0246052 | A1 * | 10/2007 | Hegde et al. | 128/848 |
| 2009/0317442 | A1 * | 12/2009 | Banister et al. | 424/423 |
| 2010/0141085 | A1 * | 6/2010 | Wu et al. | 310/311 |
| 2010/0244634 | A1 * | 9/2010 | Nagai et al. | 310/364 |
| 2011/0049404 | A1 * | 3/2011 | Suda | 251/129.01 |

FOREIGN PATENT DOCUMENTS

| | | |
|---|---|---|
| JP | 2007-143300 | 6/2007 |
| JP | 2007-329334 | 12/2007 |
| JP | 2008-86185 | 4/2008 |
| JP | 2008-251697 | 10/2008 |

* cited by examiner

*Primary Examiner* — J. San Martin

(74) *Attorney, Agent, or Firm* — K&L Gates LLP

(57) ABSTRACT

An actuator includes: an ion conductive polymer layer including an ion conductive polymer; a pair of electrode layers disposed on both surfaces of the ion conductive polymer layer; and an ionic liquid contained in the ion conductive polymer layer and the electrode layers; wherein the electrode layers contain at least an ion conductive polymer and carbon powder, and kinds of carbon powders included on an inside and an outside of the electrode layers are different from each other.

7 Claims, 6 Drawing Sheets

ACTUATOR

CROSS REFERENCES TO RELATED APPLICATIONS

The present application claims priority to Japanese Priority Patent Application JP 2009-084104 filed with the Japan Patent Office on Mar. 31, 2009, the entire content of which is hereby incorporated by reference.

BACKGROUND

The present application relates to a polymer actuator, and particularly to a polymer actuator that is bent or deformed according to an electric field applied thereto.

A polymer actuator using an ion conductive polymer (ion exchange resin) is drawing attention as a new actuator because the polymer actuator has light weight and generates great force, for example. In general, the polymer actuator has electrode layers disposed on both surfaces of an ion conductive polymer layer formed by containing an ion conductive medium such as water or the like and ions in an ion conductive polymer (ion exchange resin) film. In the polymer actuator, by applying a voltage between the pair of electrode layers, ions move within the ion conductive polymer layer, whereby the ion conductive polymer layer is bent or deformed.

However, such an existing polymer actuator has water as ion conductive medium, and thus has a problem of not being operational when the water is evaporated and dried up. Accordingly, a polymer actuator using an ionic liquid in related art has been proposed (see, for example Japanese Patent Laid-Open No. 2007-143300, hereinafter referred to as Patent Document 1, Japanese Patent Laid-Open No. 2007-329334 as Patent Document 2, Japanese Patent Laid-Open No. 2008-086185 as Patent Document 3, and Japanese Patent Laid-Open No. 2008-251697 as Patent Document 4). The ionic liquid is a salt in liquid form at normal temperature, and is nonvolatile. Thus, reliability can be improved by using this ionic liquid.

Further, polymer actuators described in Patent Documents 1 and 2 have electrode layers formed by applying a composition obtained by dispersing carbon powder into an ion conductive polymer to both surfaces of an ion conductive polymer film. Thus forming the electrode layers with the ion conductive polymer and the carbon powder can improve productivity and reduce manufacturing cost.

SUMMARY

However, the existing techniques described above have the following problems. Existing polymer actuators using an ionic liquid as described in Patent Documents 1 to 4 eliminate a need for an ion conductive medium such as water or the like, and therefore a range of applications of the existing polymer actuators can be extended. On the other hand, the existing polymer actuators have a small amount of deformation and low operation efficiency.

Accordingly, it is desirable to provide a polymer actuator having high efficiency and a large amount of deformation.

An actuator according to an embodiment includes: an ion conductive polymer layer including an ion conductive polymer; a pair of electrode layers disposed on both surfaces of the ion conductive polymer layer; and an ionic liquid contained in the ion conductive polymer layer and the electrode layers; wherein the electrode layers contain at least an ion conductive polymer and carbon powder, and kinds of carbon powders included on an inside and an outside of the electrode layers are different from each other.

In the present application, the electrode layers are formed by the ion conductive polymer and the carbon powder, and the kind of the carbon powder is changed between the inside (side of the ion conductive polymer layer) and the outside of the electrode layers. Therefore, an amount of swelling differs between the inside and the outside. Thus, when a voltage is applied between the electrode layers and the electrode layers are swelled, no repulsion occurs between the inside and the outside, and thus a larger amount of deformation is obtained.

The electrode layers in the actuator may have a region where the carbon powder situated on the inside and the carbon powder situated on the outside are mixed with each other, and a ratio between the carbon powders may change gradually.

In addition, for example, the carbon powder situated on the inside of the electrode layers may have a smaller specific surface area than the carbon powder situated on the outside.

In this case, the specific surface area of the carbon powders present in the electrode layers can be increased with increasing distance from the ion conductive polymer layer.

In addition, for example, the carbon powder situated on the inside of the electrode layers may have a larger particle size than the carbon powder situated on the outside.

In this case, the particle size of the carbon powders present in the electrode layers can be decreased with increasing distance from the ion conductive polymer layer.

Further, a metallic conductive layer may be disposed on each electrode layer.

According to the present application, kinds of carbon powders included on the inside and the outside of electrode layers are changed, and thus a polymer actuator having high efficiency and a large amount of deformation can be realized.

Additional features and advantages are described herein, and will be apparent from the following Detailed Description and the figures.

DETAILED DESCRIPTION

The present application will hereinafter be described in detail with reference to the accompanying drawings according to an embodiment. It is to be noted that the present application is not limited to each of the embodiments to be shown in the following. Description will be made in the following order.

1. First Embodiment (Example Using Carbon Powders Having Different Specific Surface Areas)

2. Second Embodiment (Example Using Carbon Powders Having Different Particle Diameters)

3. Example of Modification (Example Provided with Metallic Conductive Layer)

<1. First Embodiment>

[General Constitution]

Figure 1:
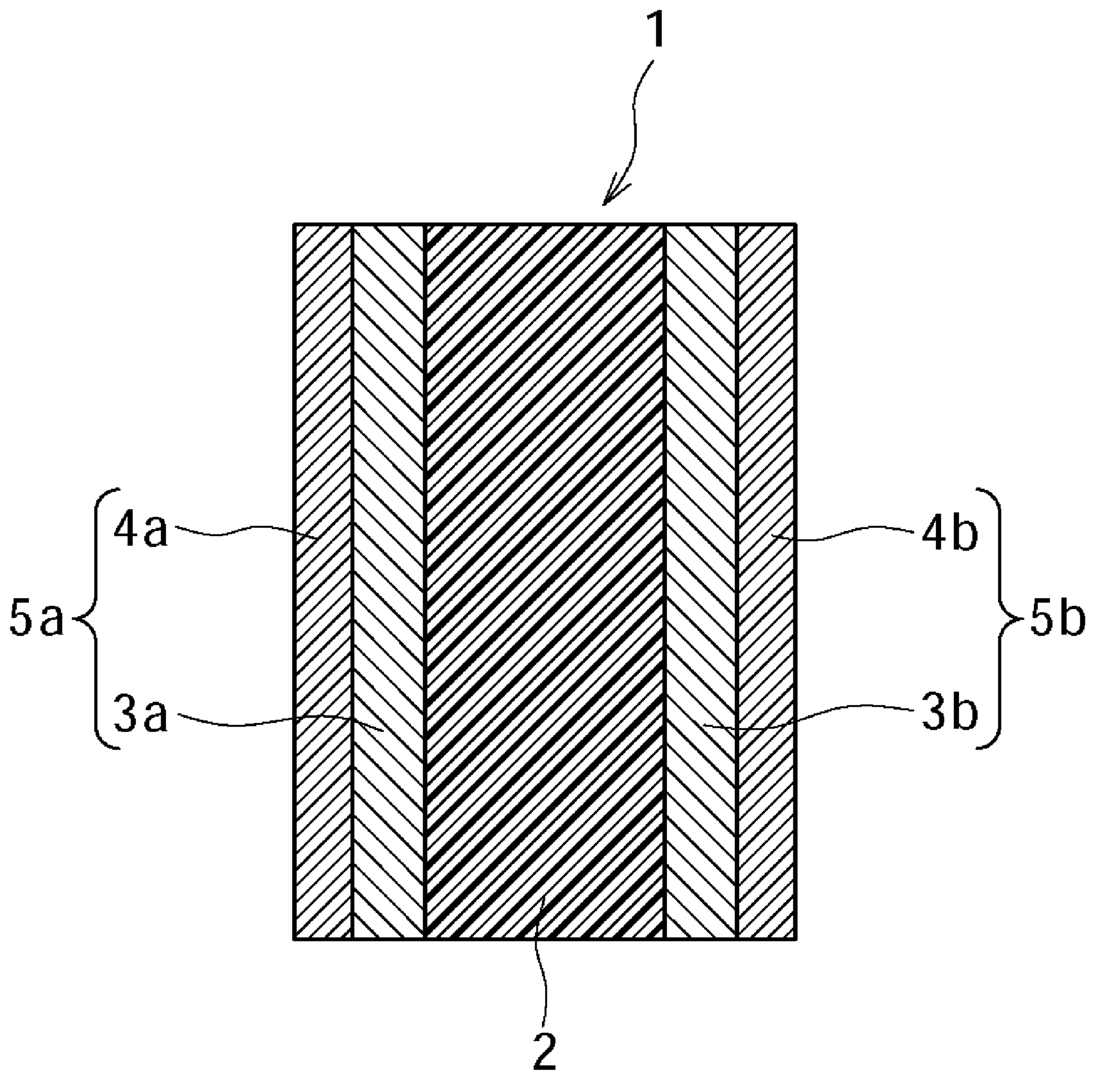
FIG. 1 is a sectional view schematically showing a constitution of an actuator according to a first embodiment.

An actuator according to a first embodiment will first be described. FIG. 1 is a sectional view schematically showing a constitution of the actuator according to the present embodiment. As shown in FIG. 1, the actuator 1 according to the present embodiment has a pair of electrode layers 5*a* and 5*b* provided so as to sandwich an ion conductive polymer layer 2. The ion conductive polymer layer 2 and the electrode layers 5*a* and 5*b* contain an ionic liquid therein in a state of being movable according to an electric field being applied. Each of the electrode layers 5*a* and 5*b* is connected to an external power supply (not shown) via a lead (not shown) or the like.

[Ion Conductive Polymer Layer 2]

The ion conductive polymer layer 2 is formed by a film or the like made of an ion conductive polymer exhibiting electric conductivity with ions propagating between polymer chains. Such an ion conductive polymer includes for example a fluorine base or hydrocarbon base ion exchange resin. The ion exchange resin has a property of selectively allowing specific ions to pass through. The ion exchange resin includes a negative ion (anion) exchange resin, a positive ion (cation) exchange resin, and a both-ion exchange resin.

The actuator 1 according to the present embodiment can use any of these ion exchange resins. However, when a cation exchange resin is used, for example, and a voltage is applied between the electrode layers, only cations in the ionic liquid can be moved more quickly. Such cation exchange resins include cation exchange resins obtained by introducing a functional group such as a sulfo group (—$SO_3H$), a carboxyl group (—COOH) or the like into a polyethylene, a polystyrene, and a fluorine base resin or the like. However, cation exchange resins obtained by introducing these functional groups into a fluorine base resin are particularly suitable.

Incidentally, the shape of the ion conductive polymer layer 2 is not limited to a sheet shape. For example, an arbitrary shape such as a strip shape, a disk shape, a column shape, a cylindrical shape or the like can be selected. In addition, the thickness of the ion conductive polymer layer 2 is not particularly limited either, but is able to be set appropriately according to the shape, size, and the like of the actuator 1. However, in the case of the stripe shape, for example, the thickness of the ion conductive polymer layer 2 is desirably 30 to 200 μm.

[Electrode Layers 5*a* and 5*b]*

The electrode layers 5*a* and 5*b* are formed mainly of an ion conductive polymer and two or more kinds of carbon powders having different specific surface areas. The specific surface areas of the carbon powders included on the inside and the outside of the electrode layers 5*a* and 5*b* are different from each other. As the specific surface area of carbon powder is increased, ions collected on the periphery of the carbon powder are increased in number. Therefore, an amount of swelling is increased in a part where carbon powder with a large specific surface area is present. Accordingly, disposing a carbon powder with a small specific surface area on the inside and disposing a carbon powder with a large specific surface area on the outside can make the amount of swelling on the outside of the electrode layers 5*a* and 5*b* larger. It is thereby possible to suppress repulsion due to swelling on the inside of the electrode layers 5*a* and 5*b*, and obtain a large amount of deformation efficiently.

At this time, the above-described effects are obtained when the specific surface area of the carbon powder situated on the inside of the electrode layers 5*a* and 5*b* is only slightly smaller than the specific surface area of the carbon powder situated on the outside of the electrode layers 5*a* and 5*b*. However, an optimum condition is satisfied when the shape of the actuator 1 being bent coincides with a difference in rate of swelling between the inside and the outside of the electrode layers 5*a* and 5*b*. This condition can be derived from a state in which the whole of the actuator 1 is uniformly bent.

Figure 2A:
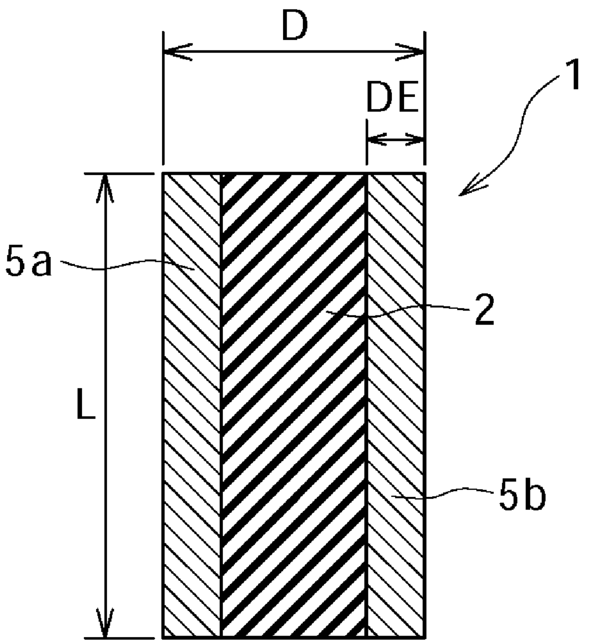
FIG. 2A is a sectional view schematically showing the actuator 1 in a state of no voltage being applied to the actuator 1.
Figure 2B:
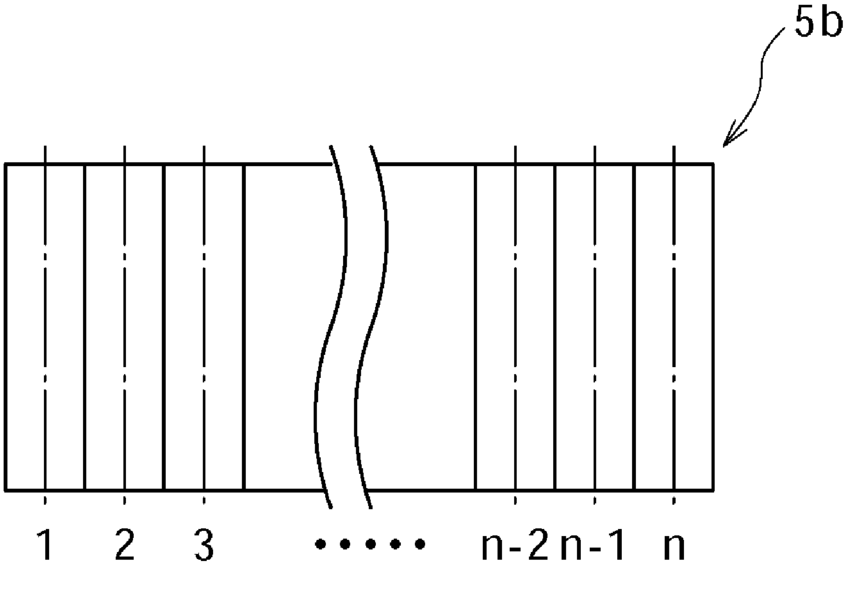
FIG. 2B is a sectional view schematically showing the state of one electrode layer 5*b* of the actuator 1.
Figure 3A:
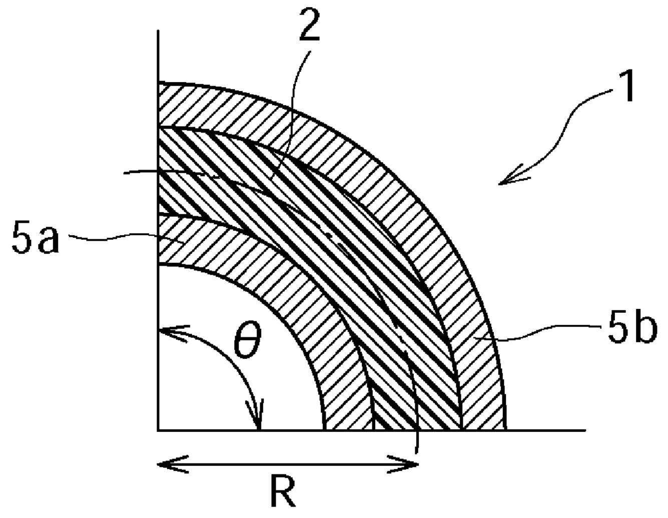
FIG. 3A is a sectional view schematically showing the actuator 1 in a bent state.
Figure 3B:
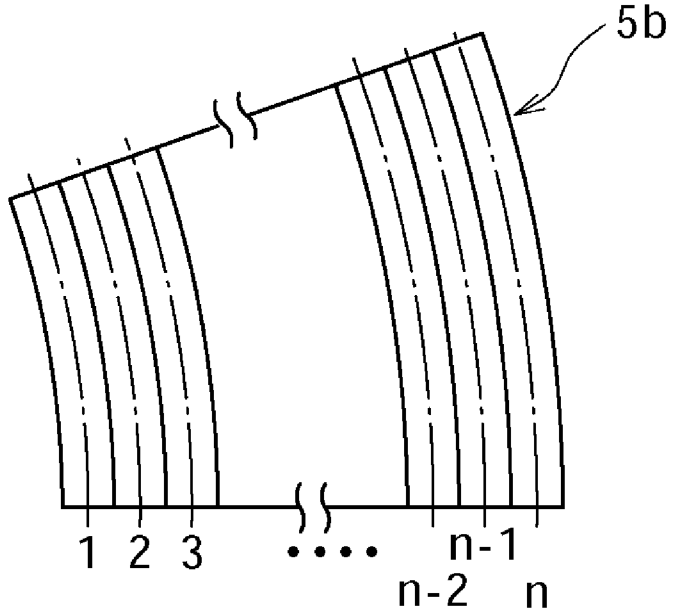
FIG. 3B is a sectional view schematically showing the state of one electrode layer 5*b* of the actuator 1.

FIG. 2A is a sectional view schematically showing the actuator 1 in a state of no voltage being applied to the actuator 1. FIG. 2B is a sectional view schematically showing the state of one electrode layer 5*b* of the actuator 1. FIG. 3A is a sectional view schematically showing the actuator 1 in a bent state. FIG. 3B is a sectional view schematically showing the state of one electrode layer 5*b* of the actuator 1. As shown in FIG. 2A and FIG. 3A, letting a maximum amount of bending of the actuator 1 having an overall thickness D (mm) and an overall length L (mm) with the electrode layers 5*a* and 5*b* having a thickness DE (mm) be an angle θ (°), the radius R (mm) of a circle having the center of the actuator 1 as an arc thereof can be expressed by the following Equation 1.

$$R = \frac{1}{2\pi} \times \frac{360}{\theta} \times L \qquad \text{[Equation 1]}$$

In addition, as shown in FIG. 2B and FIG. 3B, when the electrode layers 5*a* and 5*b* are formed with n (n is a natural number of one or more) kinds of carbon powders having different specific surface areas, and are divided into n layers for each kind of carbon powder, the swelling of the layers is proportional to the elongation percentages of central parts of these layers. In this case, the length Li of the central part of an ith layer from the inside when the actuator 1 is bent is expressed by the following Equation 2.

$$L_i = \left\{R + \frac{1}{2}(D - 2DE) + \frac{2i-1}{2n} \times DE\right\} \times 2\pi \times \frac{\theta}{360} \qquad \text{[Equation 2]}$$

An amount Xi of elongation of the ith layer from the inside is a difference between the length L of the central part of the actuator 1 and the length Li of the central part of the ith layer, and is thus expressed by the following Equation 3.

$$\begin{aligned} X_i &= \left\{R + \frac{1}{2}(D - 2DE) + \frac{2i-1}{2n} \times DE\right\} \times 2\pi \times \frac{\theta}{360} - L \\ &= \left\{\frac{1}{2}(D - 2DE) + \frac{2i-1}{2n} \times DE\right\} \times 2\pi \times \frac{\theta}{360} \end{aligned} \qquad \text{[Equation 3]}$$

Further, a ratio Ai between the elongation percentage of the ith layer and the elongation percentage of an outermost layer (nth layer) is expressed by the following Equation 4.

$$A_i = \frac{\left\{\frac{1}{2}(D-2DE) + \frac{2i-1}{2n} \times DE\right\} \times 2\pi \times \frac{\theta}{360}}{\left\{\frac{1}{2}(D-2DE) + \frac{2n-1}{2n} \times DE\right\} \times 2\pi \times \frac{\theta}{360}} = \frac{\frac{1}{2}(D-2DE) + \frac{2i-1}{2n} \times DE}{\frac{1}{2}(D-2DE) + \frac{2n-1}{2n} \times DE} = \frac{D-2DE+\frac{2i-1}{n} \times DE}{D-\frac{DE}{n}} \quad \text{[Equation 4]}$$

Hence, when the specific surface area of the carbon powder situated in the outermost layer of the electrode layers 5*a* and 5*b* is S (m2/g), the specific surface area Si of the carbon powder in the ith layer from the inside can be expressed by the following Equation 5. Incidentally, the specific surface area in this case refers to a value measured by a BET method (nitrogen gas adsorption).

$$S_i = A_i \times S \quad \text{[Equation 5]}$$

For example, when the thickness D of the actuator 1 is 100 μm, the thickness of the electrode layers 5*a* and 5*b* is 3 μm, the number of divisions (kinds of carbon powders) of the electrode layers 5*a* and 5*b* is 3, and the specific surface area of the carbon powder included in the outermost layer is 500 $m^2/g$, the specific surface area of the carbon powder included in the innermost layer is about 280 $m^2/g$, and the specific surface area of the carbon powder included in the middle layer is about 390 $m^2/g$. Incidentally, these conditions are conditions in an ideal case. Effects of the present application are obtained even in cases outside the conditions as long as the specific surface area of the carbon powder situated on the inside of the electrode layers 5*a* and 5*b* is smaller than the specific surface area of the carbon powder situated on the outside.

In addition, it is desirable that the electrode layers 5*a* and 5*b* in the actuator 1 according to the present embodiment desirably have a region where the carbon powder situated on the inside and the carbon powder situated on the outside are mixed with each other and that the ratio between the carbon powders change gradually. Specifically, it is desirable that the specific surface area of the carbon powders present increase as distance from the ion conductive polymer layer 2 is increased, that is, from the inside to the outside. Such a skewed distribution can reduce difference in amount of swelling between the layers, thus reducing distortion within the actuator and improving operation efficiency.

While the same ion conductive polymer as that of the above-described ion conductive polymer film can be used as the ion conductive polymer forming the electrode layers 5*a* and 5*b*, various ion conductive resins such as a fluorine base ion exchange resin, a hydrocarbon base ion exchange resin and the like can also be used for the ion conductive polymer forming the electrode layers 5*a* and 5*b*.

Incidentally, the thickness and shape of the electrode layers 5*a* and 5*b* can be set appropriately according to the shape, size and the like of the above-described ion conductive polymer layer 2. For example, when the thickness of the ion conductive polymer layer 2 is 50 μm, the thickness of the electrode layers 5*a* and 5*b* can be 10 to 100 μm.

[Ionic Liquid]

The ionic liquid is a salt composed of only ions (anions and cations). The ionic liquid is referred to also as a normal temperature (room temperature) molten salt. The ionic liquid exhibits properties of nonflammability, nonvolatility, high ion conductivity, high heat resistance and the like. Such an ionic liquid includes for example an imidazolium base ionic liquid, a pyridinium base ionic liquid, and an aliphatic base ionic liquid. The actuator 1 according to the present embodiment contains this ionic liquid in the ion conductive polymer layer 2 and the electrode layers 5*a* and 5*b*, thus eliminating a need for an ion conductive medium such as water or the like. As a result, a need for a volatilization preventing process such as sealing or the like is eliminated, and a range of applications of the actuator 1 can be widened.

[Manufacturing Method]

The actuator 1 having the above-described constitution can be manufactured by the following method, for example. First, two or more kinds of carbon powders having different specific surface areas are prepared, and are each dispersed in a solvent together with an ion conductive polymer and thereby formed into a paint. Thus a plurality of paints having different kinds (specific surface areas) of carbon powders are prepared. It suffices for the solvent used at this time only to allow the ion conductive polymer to be dissolved and to have volatility. In addition, a plurality of solvents may be used in a blended state as the dispersing solvent. Further, after the dispersion, the dispersing solvent can be used in a state of being diluted by ethanol or the like as required.

A compounding ratio of the ion conductive polymer to the carbon powders can be 1:1 to 1:10 in terms of mass ratio. However, the compounding ratio of the ion conductive polymer to the carbon powders is not limited to this range, and can be set appropriately according to the types of the ion conductive polymer and the carbon powders and the like.

Next, both surfaces of the ion conductive polymer membrane or ion conductive polymer film forming the ion conductive polymer layer 2 are coated with each of the paints. Thereafter the solvent is removed. Thereby the electrode layers 5*a* and 5*b* of a predetermined thickness are formed. Specifically, a paint including one carbon powder is applied and dried, and thereafter a paint including another carbon powder is applied. A method of the application is not particularly limited. Publicly known methods such as a roll coating method, a spray coating method, a dipping method, screen printing and the like can be applied as a method of the application.

Incidentally, a method of forming the electrode layers is not limited to a method of applying paints containing different kinds of carbon powders. Various methods can be applied as a method of forming the electrode layers. For example, the electrode layers can be formed also by fabricating a plurality of kinds of sheets (films and membranes) formed of an ion conductive polymer and carbon powder and containing different kinds of carbon powder, laminating the plurality of kinds of sheets in predetermined order, and integrating the plurality of kinds of sheets by thermocompression bonding or the like.

In addition, at this time, it is desirable to apply a paint including a carbon powder having a small specific surface area and thereafter apply a paint including a carbon powder having a large specific surface area. Further, when three or more kinds of paints including carbon powders of different specific surface areas are used, it is desirable to apply the paints in order starting with a paint containing a carbon powder of a small specific surface area. Thereby, a skewed distribution can be formed such that the specific surface area of the carbon powders present is increased from the inside to the outside of the electrode layers 5*a* and 5*b*.

Thereafter, the ion conductive polymer layer 2 and the electrode layers 5*a* and 5*b* are made to contain an ionic liquid. Specifically, a constitution obtained by forming the electrode layers 5*a* and 5*b* on both sides of the ion conductive polymer layer 2 is immersed in the ionic liquid, whereby the ionic liquid is impregnated into the inside of the constitution.

[Operation]

Figure 4A:
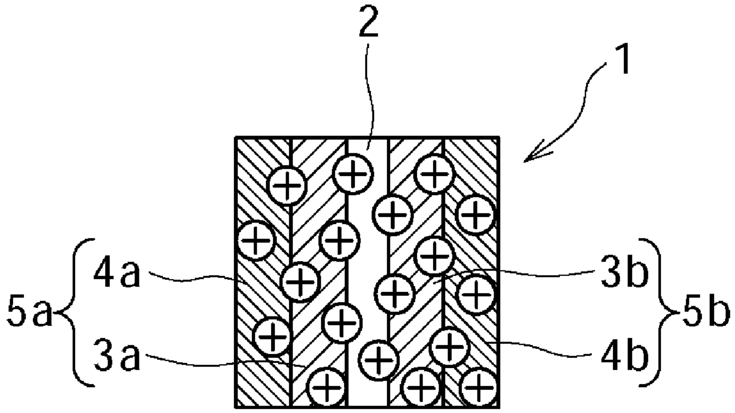
FIGS. 4A to 4C are sectional views schematically showing operation of the actuator 1 shown in FIG. 1, FIG. 4A showing a state in which no voltage is applied, FIG. 4B showing a state in which ions are moving due to application of a voltage, and FIG. 4C showing a state in which ions have moved and reached saturation due to application of a voltage.
Figure 4B:
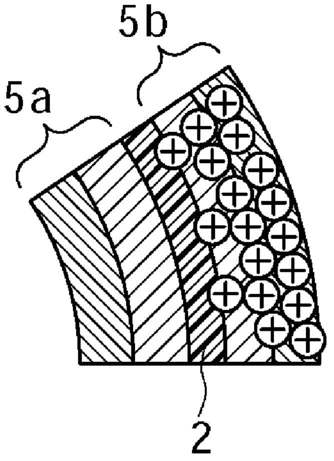
Figure 4C:
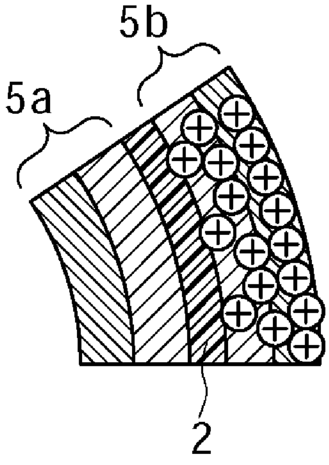
Figure 5A:
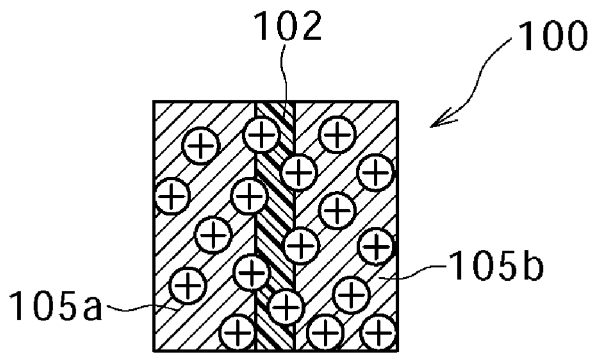
FIGS. 5A to 5C are sectional views schematically showing operation of an existing actuator, FIG. 5A showing a state in which no voltage is applied, FIG. 5B showing a state in which ions are moving due to application of a voltage, and FIG. 5C showing a state in which ions have moved and reached saturation due to application of a voltage.
Figure 5B:
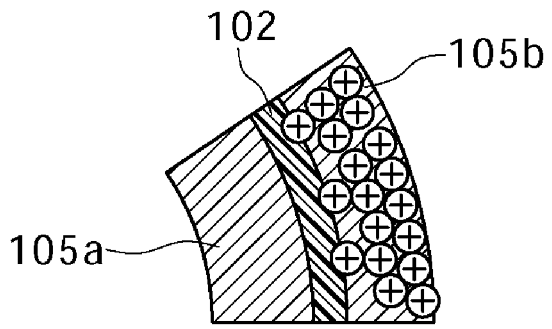
Figure 5C:
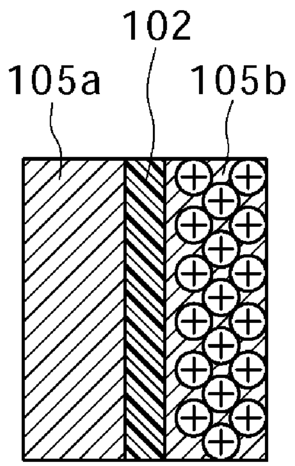

Next, operation of the actuator 1 according to the present embodiment will be described by taking as an example a case where a positive ion (cation) exchange resin is used for an ion conductive polymer forming the ion conductive polymer layer 2 and the electrode layers 5*a* and 5*b*. FIGS. 4A to 4C are sectional views schematically showing operation of the actuator 1 shown in FIG. 1, FIG. 4A showing a state in which no voltage is applied, FIG. 4B showing a state in which ions are moving due to application of a voltage, and FIG. 4C showing a state in which ions have moved and reached saturation due to application of a voltage. FIGS. 5A to 5C are sectional views schematically showing operation of an existing actuator, FIG. 5A showing a state in which no voltage is applied, FIG. 5B showing a state in which ions are moving due to application of a voltage, and FIG. 5C showing a state in which ions have moved and reached saturation due to application of a voltage.

As shown in FIG. 4A, when no voltage is applied to the actuator 1 according to the present embodiment, the actuator 1 is in a straight state with ions distributed uniformly within the actuator 1. Incidentally, while FIG. 4A shows only positive (+) ions, negative (−) ions are similarly distributed uniformly within the actuator 1.

On the other hand, when a voltage is applied between the electrode layers 5*a* and 5*b* by an external power supply (not shown), cations move to a negative electrode side, and anions move to a positive electrode side. For example, as shown in FIG. 4B, when a positive potential is applied to the electrode layer 5*a*, and a negative potential is applied to the electrode layer 5*b*, anions (not shown) collect in the electrode layer 5*a*, and cations collect in the electrode layer 5*b*. At this time, anions do not move easily within the positive ion (cation) exchange resin, and thus mainly cations move within the positive ion (cation) exchange resin. Then, a difference in concentration due to uneven distribution of the cations causes a difference in volume between the electrode layers 5*a* and 5*b*, and causes the whole of the actuator 1 to be bent (deformed). That is, the electrode layer 5*b* in which cations are increased swells, and the electrode layer 5*a* in which cations are decreased contracts.

Incidentally, when a negative ion (anion) exchange resin is used for the ion conductive polymer forming the ion conductive polymer layer 2 and the electrode layers 5*a* and 5*b*, or when the voltage applied between the electrode layers 5*a* and 5*b* is reversed in polarity, the actuator 1 is bent in an opposite direction. In addition, the actuator 1 allows the bending direction to be controlled easily by changing the polarity of the DC voltage. Further, while in FIG. 4B, all cations move to the electrode layer 5*b*, the present application is not limited to this. Cations may remain in the electrode layer 5*a*.

As shown in FIGS. 5A to 5C, in an existing actuator 100 with carbon powder unchanged in kind between the inside and the outside of electrode layers 105*a* and 105*b*, an amount of swelling on the inside of the electrode layers 105*a* and 105*b* is equal to an amount of swelling on the outside of the electrode layers 105*a* and 105*b* when a voltage is applied. Thus, when the electrode layers 105*a* and 105*b* are thick, even if the outside of the electrode layers 105*a* and 105*b* is swelled and bent (deformed), the outside of the electrode layers 105*a* and 105*b* is pushed back by the force of swelling on the inside. Consequently an amount of bending (amount of deformation) of the actuator 100 as a whole is reduced.

On the other hand, in the actuator 1 according to the present embodiment, the specific surface areas of carbon powders in inside electrode layers 3*a* and 3*b* and outside electrode layers 4*a* and 4*b* are changed, so that the pushing back of the inside electrode layers 3*a* and 3*b* can be suppressed. Specifically, as shown in FIG. 4C, in the outside electrode layers 4*a* and 4*b* including a carbon powder of a large specific surface area, an electric double layer is formed on the periphery of the carbon powder and collects more ions, so that an amount of swelling is increased. On the other hand, the inside electrode layers 3*a* and 3*b* including a carbon powder of a small specific surface area collect a smaller amount of ions than the outside electrode layers 4*a* and 4*b*, thus correspondingly reducing an amount of swelling. Thereby a repulsive force caused by the swelling of the inside electrode layers 3*a* and 3*b* can be reduced.

Thus, in the actuator 1 according to the present embodiment, the carbon powders contained on the inside and the outside of the electrode layers 5*a* and 5*b* differ in specific surface area, and therefore an amount of swelling at the time of application of voltage can be changed between the inside and the outside of the electrode layers 5*a* and 5*b*. Thus, the amount of swelling of the inside electrode layers 3*a* and 3*b* can be reduced by making the carbon powder mixed in the inside electrode layers 3*a* and 3*b* have a smaller specific surface area than the carbon powder mixed in the outside electrode layers 4*a* and 4*b*, for example. As a result, repulsive force occurring at the time of application of voltage is reduced. It is thus possible to improve deformation efficiency and increase an amount of deformation.

<2. Second Embodiment>

[General Constitution]

An actuator according to a second embodiment will next be described. While the foregoing first embodiment has been described by taking as an example an actuator using two or more kinds of carbon powders having different specific surface areas, the present application is not limited to this. It is also possible to use two or more kinds of carbon powders having different particle sizes. Specifically, the actuator according to the present embodiment has a pair of electrode layers provided so as to sandwich an ion conductive polymer layer. Each electrode layer is composed mainly of an ion conductive polymer and two or more kinds of carbon powders having different particle sizes.

[Electrode Layers]

The carbon powders included on the inside and the outside of the electrode layers in the actuator according to the present embodiment have different particle sizes. Incidentally, particle size in this case refers to a particle size distribution obtained by a dynamic light scattering method (FFT power spectrum method) or an average value of outside diameters of particles measured in a SEM (Scanning Electron Microscope) photograph. As particle size is decreased, carbon powder increases specific surface area per unit volume, and therefore the number of ions collected on the periphery of the carbon powder is increased. That is, the smaller the particle size of carbon powder included in a layer, the larger the amount of swelling of the layer. Accordingly, disposing a carbon powder having a large particle size on the inside and disposing a carbon powder having a small particle size on the outside can reduce an amount of swelling on the inside of the electrode layers and further increase an amount of swelling on the outside of the electrode layers. As a result, repulsion due to swelling on the inside of the electrode layers is suppressed, and thus a large amount of deformation can be obtained efficiently.

At this time, the above-described effects are obtained when the particle size of the carbon powder situated on the outside of the electrode layers is only slightly smaller than the particle size of the carbon powder situated on the inside of the electrode layers. However, there is preferably a difference in particle size by a factor of about 2 to 10 between an innermost layer and an outermost layer. Further, it is more desirable that the specific surface area of carbon powder satisfy the condition shown in the above Equation 5. Thereby the effect of suppressing repulsive force can be further enhanced.

Incidentally, similar effects can be obtained by changing the content of carbon powder between the inside and the outside of the electrode layers, or specifically reducing the content of carbon powder on the inside without changing the kind of the carbon powder. In this case, however, because the content of carbon powder is decreased, the resistance value of the electrode layers is raised, and characteristics of the actuator may be degraded.

In addition, it is desirable that as with the actuator according to the foregoing first embodiment, the actuator according to the present embodiment have a region where a carbon powder of a small diameter and a carbon powder of a large diameter are both mixed with each other and that the ratio between the carbon powders change gradually. Specifically, it is desirable that the particle size of the carbon powders present decrease as distance from the ion conductive polymer layer is increased, that is, from the inside to the outside. Such a skewed distribution reduces difference in amount of swelling between the layers, and reduces distortion within the actuator, thus improving operation efficiency.

Thus, in the actuator according to the present embodiment, the particle sizes of the carbon powders contained on the inside and the outside of the electrode layers differ from each other, and thus a difference in amount of swelling at the time of application of voltage can be provided between the inside and the outside of the electrode layers. Thus, the amount of swelling of the inside electrode layers can be reduced by making the carbon powder mixed in the inside electrode layers have a larger particle size than the carbon powder mixed in the outside electrode layers. As a result, repulsive force occurring at the time of application of voltage is reduced. It is thus possible to improve deformation efficiency and increase an amount of deformation.

Incidentally, the constitution, operation, and effect of the actuator according to the present embodiment other than those described above are similar to those of the actuator according to the foregoing first embodiment.

<3. Example of Modification>

Figure 6:
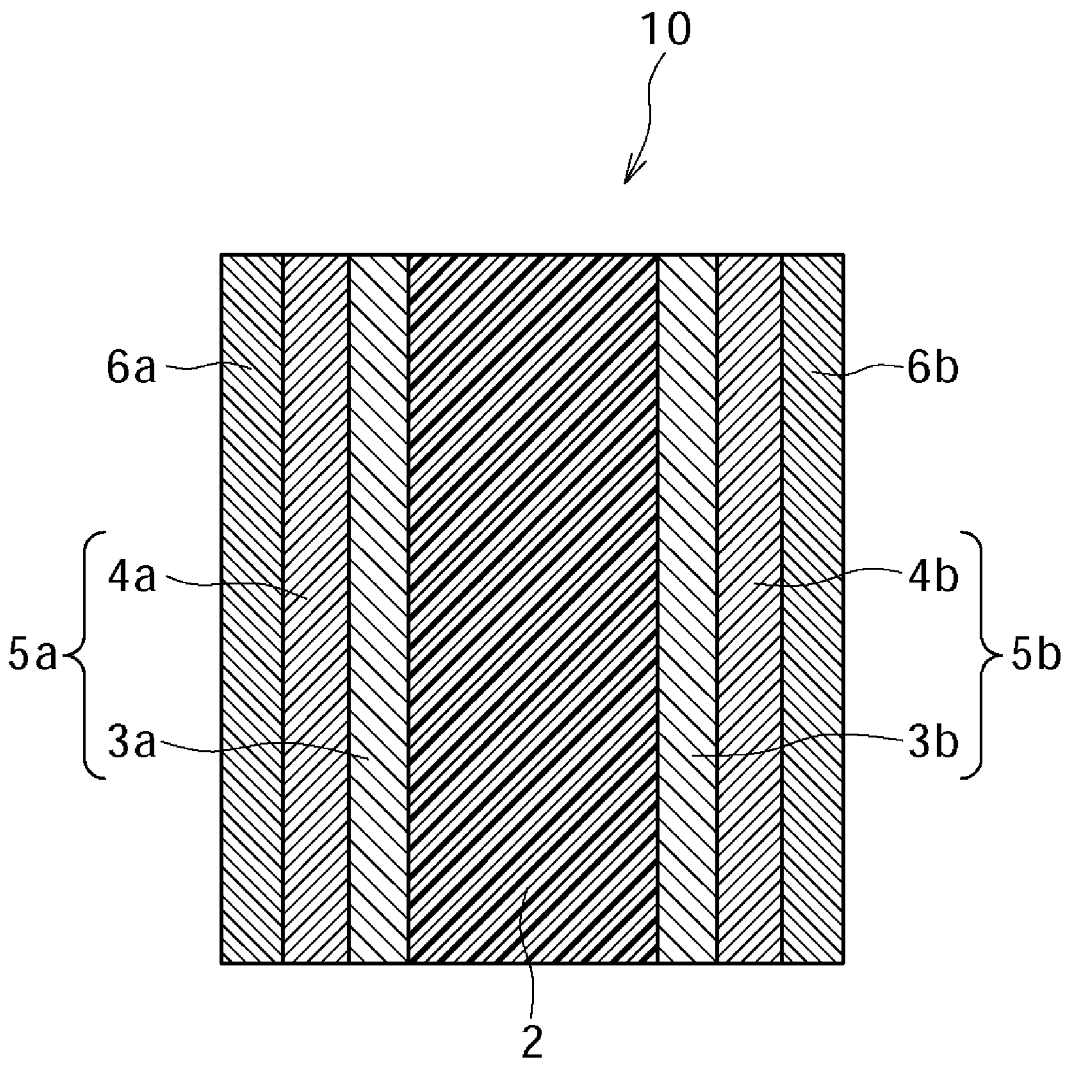
FIG. 6 is a sectional view schematically showing a constitution of an actuator according to an example of modification of the present application.

An actuator according to an example of modification of the foregoing first and second embodiments will next be described. FIG. 6 is a sectional view schematically showing a constitution of an actuator according to the present example of modification. Incidentally, in FIG. 6, same constituent elements as in the actuator 1 shown in FIG. 1 are identified by the same reference symbols, and detailed description thereof will be omitted. As shown in FIG. 6, the actuator 10 according to the present example of modification has a pair of electrode layers 5*a* and 5*b* provided so as to sandwich an ion conductive polymer layer 2, and further includes metallic conductive layers 6*a* and 6*b* formed on the respective electrode layers 5*a* and 5*b*. In this actuator 10, a lead (not shown) is connected to the metallic conductive layers 6*a* and 6*b*, and the electrode layers 5*a* and 5*b* are connected to an external power supply (not shown) via the metallic conductive layers 6*a* and 6*b* and the leads.

[Metallic Conductive Layers 6*a* and 6*b*]

The metallic conductive layers 6*a* and 6*b* can be formed by a metallic material having excellent conductivity and resisting oxidation such as gold, platinum or the like. While the thickness of the metallic conductive layers 6*a* and 6*b* is not particularly limited, the metallic conductive layers 6*a* and 6*b* desirably have such a thickness as to be a continuous film for uniform application of a voltage from the lead to the electrode layers 5*a* and 5*b*. In addition, a method of forming the metallic conductive layers 6*a* and 6*b* is not particularly limited either, and publicly known film forming methods such as a plating method, an evaporating method, a sputtering method and the like can be applied.

In the actuator 10 according to the present example of modification, because the metallic conductive layers 6*a* and 6*b* are provided on the electrode layers 5*a* and 5*b*, surface resistance is sufficiently low, and thus voltage is applied to the whole of the actuator uniformly. Thereby, the whole of the actuator can be deformed uniformly.

Incidentally, while the present example of modification has been described by taking as an example a case where the metallic conductive layers 6*a* and 6*b* are provided to the actuator 1 according to the first embodiment shown in FIG. 1, similar effects are naturally obtained when the metallic conductive layers 6*a* and 6*b* are applied to the actuator according to the foregoing second embodiment. Incidentally, the constitution, operation, and effect of the actuator 10 according to the present example of modification other than those described above are similar to those of the actuators according to the foregoing first and second embodiments.

[Embodiment]

Effects of the present application will be concretely described in the following by an embodiment. First, the actuator 1 shown in FIG. 1 was fabricated as an embodiment. At that time, ion conductive film Nafion (registered trademark) NRE-212 (thickness: 50 μm, functional group: sulfo group) manufactured by DuPont was used as an ion conductive film forming the ion conductive polymer layer 2. In addition, ion exchange resin Nafion (registered trademark) dispersion liquid (DE2020, functional group: sulfo group) manufactured by DuPont was used for an ion conductive polymer forming the electrode layers 5*a* and 5*b*, and a carbon powder having a specific surface area of 800 $m^2/g$ (carbon powder A) and a carbon powder having a specific surface area of 1200 $m^2/g$ (carbon powder B) were used.

Then, the ion conductive polymer and each carbon powder were mixed so as to be 1:1 in terms of mass ratio, and were further diluted by adding ethanol such that a solid content concentration was 5 percent by weight. Thereafter, the composition was dispersed for eight hours by an AJITER (reciprocating shaker). Thereby two kinds of paints including carbon powders having different specific surface areas were prepared.

Next, the paint including the carbon powder A having a small specific surface area was applied to both surfaces of the ion conductive film by a spray coater, dried, and then subjected to heat treatment by hot pressing. This process was repeated to form the inside electrode layers 3*a* and 3*b* having a thickness of 25 μm. Thereafter, by a similar method, the paint including the carbon powder B having a large specific surface area was applied onto the inside electrode layers 3*a* and 3*b*, and then dried and subjected to heat treatment, to form the outside electrode layers 4*a* and 4*b* having a thickness of 25 μm. Then, a constitution obtained by forming the electrode layers on both surfaces of the ion conductive film was immersed in an imidazolium base ionic liquid, whereby the ionic liquid was impregnated into the inside of the constitution. Thereby the actuator according to the embodiment was fabricated.

In addition, the existing actuator 100 shown in FIGS. 5A to 5C was fabricated as a comparative example of the present application. The actuator 100 was the same as the actuator according to the embodiment described above except that only a carbon powder having a specific surface area of 800 $m^2/g$ was contained in the electrode layers 105*a* and 105*b* at the time of the fabrication.

Next, a lead was connected to each of the electrode layers 5*a* and 5*b* and 105*a* and 105*b* of the actuators according to the embodiment and the comparative example which actuators were fabricated by the above-described method, and characteristics of the actuators were investigated. Specifically, one end of the actuators was fixed, a voltage of 2 V was applied between the electrode layers while a positive or negative potential applied to each of the pairs of electrode layers was changed in cycles of 0.1 Hz, and an amount of deformation at a position distant from the fixed bases by 15 mm was measured by a laser displacement meter. In addition, the amount of deformation was similarly measured while the application of the positive or negative potential to each electrode layer was changed at 1 Hz. As a result, it was confirmed that the actuator according to the embodiment has higher efficiency and provides a larger amount of deformation than the actuator according to the comparative example.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. An actuator comprising:

an ion conductive polymer layer including an ion conductive polymer;

a pair of electrode layers disposed on both surfaces of said ion conductive polymer layer; and an ionic liquid contained in said ion conductive polymer layer and said electrode layers;

wherein said electrode layers contain at least an ion conductive polymer and carbon powder, and kinds of carbon powders included on an inside and an outside of said electrode layers are different from each other.

2. The actuator according to claim 1, wherein said electrode layers has a region where the carbon powder situated on the inside and the carbon powder situated on the outside are mixed with each other, and a ratio between the carbon powders changes gradually.

3. The actuator according to claim 1, wherein the carbon powder situated on the inside of said electrode layers has a smaller specific surface area than the carbon powder situated on the outside.

4. The actuator according to claim 3, wherein the specific surface area of the carbon powders present in said electrode layers is increased with increasing distance from the ion conductive polymer layer.

5. The actuator according to claim 1, wherein the carbon powder situated on the inside of said electrode layers has a larger particle size than the carbon powder situated on the outside.

6. The actuator according to claim 5, wherein the particle size of the carbon powders present in said electrode layers is decreased with increasing distance from the ion conductive polymer layer.

7. The actuator according to claim 1, wherein a metallic conductive layer is disposed on each electrode layer.

* * * * *